United States Patent [19]
Von Basse et al.

[11] Patent Number: 5,732,013
[45] Date of Patent: Mar. 24, 1998

[54] MATRIX MEMORY (VIRTUAL GROUND)

[75] Inventors: Paul-Werner Von Basse, Wolfratshausen; Roland Thewes, Groebenzell; Doris Schmitt-Landsiedel, Ottobrunn; Michael Bollu, Munich, all of Germany

[73] Assignee: Siemens Aktiengesellschaft, Munich, Germany

[21] Appl. No.: 780,494

[22] Filed: Jan. 8, 1997

[30] Foreign Application Priority Data

Jan. 8, 1996 [DE] Germany .................... 196 00 424.1

[51] Int. Cl.$^6$ ................................................. G11C 17/00
[52] U.S. Cl. ........................................ 365/104; 365/189.11
[58] Field of Search ............................. 365/104, 189.11

[56] References Cited

U.S. PATENT DOCUMENTS 5,117,389  5/1992  Yiu ............................................ 365/104

FOREIGN PATENT DOCUMENTS

4035660A1  5/1991  Germany .

OTHER PUBLICATIONS

"Alternate Metal Virtual Ground EPROM Array Implemented in a Process for Very High Density Applications" (Kazerounian et al.), IEDEM 91-311, 1991, pp. 11.5.1–11.5.4.

"A 65ns 1 Mb CMOS Alternate Metal Virtual Ground EPROM With Dual Reference Sensing Scheme and Word Line Voltage Regulator" (Hoang et al.), 1993, VLSITSA, pp. 336–338.

"Alternate Metal Virtual Ground (AMG) –A New Scaling Concept for Very High–Density EPROM's" (Eitan et al.), IEEE Electron Device Letters, vol. 12, No. 8, Aug. 1991, pp. 450–452, as mentioned on p. 3 of the specification.

*Primary Examiner*—David C. Nelms
*Assistant Examiner*—Michael T. Tran
*Attorney, Agent, or Firm*—Herbert L. Lerner; Laurence A. Greenberg

[57] ABSTRACT

A matrix memory with memory transistors arranged in rows and columns. The memory transistors can be addressed via word lines and bit lines. Control transistors are driven via control lines. The control transistors can short-circuit all of the columns of the cell array, i.e. the bit lines, except for the column in which a memory cell is located which is to be read out.

8 Claims, 3 Drawing Sheets

0
MATRIX MEMORY (VIRTUAL GROUND)

BACKGROUND OF THE INVENTION

Field of the Invention

The invention relates to a matrix memory with memory transistors arranged in rows and columns and addressable via word lines and bit lines.

NOR memory cells with virtual ground are the simplest memory cells in ROM matrix memories. They comprise a MOS (metal oxide semiconductor) transistor in which the information of a bit is stored by the level of the threshold voltage, i.e., when a specific potential is applied to the gate, a current flows between the source and the drain depending on whether a logic "0" or a logic "1" is stored. The memory cells are disposed between two respective two bit lines and are addressed in rows by word lines.

Prior to the read-out of a memory cell, all of the bit lines are precharged to one potential, for example to the supply voltage $V_{DD}$. All Of the word lines are connected to low potential, for example to the supply voltage $V_{SS}$. During the read-out of a memory cell, the word line to which the cell to be read out is connected is raised to high potential and the bit line to which the cell to be read out is connected is lowered to low potential. If the cell contains a MOSFET having a low threshold, this MOSFET is switched on and, via the bit line connected to low potential, discharges the adjacent bit lines which were still at high potential. If, on the other hand, the cell contains a MOSFET having a high threshold voltage, then the MOSFET remains in the off state and the adjacent bit lines do not change their potential. If not only the cell to be read out but all of the adjacent cells on the same word line contain MOS transistors having a low threshold, then these adjacent MOS transistors are also successively switched on and interconnect all of the adjacent bit lines. Therefore, not just one bit line is discharged, but rather the entire cell array after a sufficient length of time. That configuration therefore has two disadvantages. Firstly, the read-out time is dependent on the information of the adjacent cell; secondly, having a fixed evaluation time, the signal levels are dependent on the information of the adjacent cells.

In order to circumvent the above-mentioned difficulties, after the bit lines have been charged, the word line to which the cell to be read out is connected is raised to a potential which is significantly lower than the precharge potential. The bit line to which the cell to be read out is connected is subsequently lowered to low potential. As soon as the MOS transistors of the next but one cells are rendered conductive, the word line is also lowered to low potential ($V_{SS}$). The discharge operation is thus concluded.

Disadvantages of this discharge control are the relatively high low level of the read signal, a reading time which increases hyperbolically with the magnitude of the signal, and critical timing, since the reading time changes substantially with the signal swing.

Further processes—even more complicated than the one illustrated above—are described in the publications by Boaz Eitan et al. in IEEE Electron Device Letters 12, 450–452 (1991), in IEDM 91, 311–314 (1991) and in 1993 VLSITSA, 336–338 (1993).

SUMMARY OF THE INVENTION

It is accordingly an object of the invention to provide a matrix memory, which overcomes the above-mentioned disadvantages of the heretofore-known devices and methods of this general type.

With the foregoing and other objects in view there is provided, in accordance with the invention, a matrix memory, comprising:

a plurality of bit lines, a plurality of word lines, and a plurality of control lines;

a subdivision of the memory matrix into disjunct segments each forming a matrix memory with a plurality of memory transistors disposed in rows and columns; each of the memory transistors has a source and drain terminal or an emitter and collector terminal connected to a respective bit line and a gate terminal or a base terminal connected to a respective one of the word lines;

a plurality of control transistors each having a source and drain terminal or an emitter and collector terminal connected to a respective one of the bit lines and a gate terminal or a base terminal connected to a respective control line;

the control transistors are disposed such that, for each pair of bit lines for which a memory transistor is present, and which is connected to both bit lines of the pair, a potential may be set on the control lines for rendering some of the control transistors conductive so that no control transistor electrically connects the bit lines of the respective pair and such that, for each further pair of bit lines for which a memory transistor is present, and which is connected to both bit lines of the further pair, at least one of the control transistors effects an electrically conductive connection between the bit lines of the further pair; and an external bit line, a selection transistor and a further control line for each outer bit line of the segment which forms a pair of bit lines with only one other bit line of the segment, for which pair a memory transistor is present which is connected to both bit lines of the respective pair;

the source terminal and the drain terminal, or the emitter terminal and the collector terminal of the selection transistor being connected to the outer bit line or the external bit line, and the gate terminal or the base terminal of the selection transistor being connected to the further control line.

In accordance with an added feature of the invention, each segment includes a control transistor for each pair of bit lines for which a memory transistor is present, and which is connected to both bit lines of the pair, the source and drain terminals or the emitter and collector terminals of the control transistor being connected to a respective bit line of the pair of bit lines, and each control transistor being provided with a dedicated control line.

In accordance with an additional feature of the invention, each segment has an arrangement of the control transistors which corresponds to an arrangement of a binary decoder with a number of outputs equal to a number of pairs of bit lines having one of the memory transistors connected to both bit lines of the pair.

In accordance with another feature of the invention, all of the bit lines, except for two the bit lines in each segment, define two bit line pairs with two other bit lines having a memory transistor connected to both bit lines of a respective pair.

In accordance with a further feature of the invention, each segment has two external bit lines and, except for two of the external bit lines, all of the external bit lines together with two respective other external bit lines form a pair of external bit lines for which a segment is present, which segment is connected via selection transistors to both the external bit lines of the pair.

In accordance with a concomitant feature of the invention, the selection transistors which are connected to the same the external bit line are connected to respectively different control lines (ST0, ST1).

Instead of discharging an individual bit line, the entire matrix of memory cells or at least a segment of the matrix is tested for continuity. In other words it is ascertained in principle whether a current flow transversely through the matrix memory is possible when the single electrical connection used for this comprises a cell to be read out (to be tested for the stored information) and otherwise only mutually short-circuited bit lines. Therefore, all of the bit lines except for the two bit lines adjacent to the cell to be read out are electrically conductively connected to one another, the cell to be read out is activated via the relevant word line and an attempt is made to send a current from one side of the matrix or of a segment of the matrix of cells to the opposite side. In this way, a test is carried out to see whether or not the relevant cell is conductive. During this procedure, only the cell to be read out lies in the entire current path, with the result that its information can be read out by ascertaining whether or not a current can flow along this current path. If the transistor of the relevant cell has a small threshold voltage, then the current path has continuity. If the threshold voltage of the transistor in this cell is large, then the current path remains at high impedance, and at the applied voltage no current, or only a very small current, flows.

To this end, additional transistors are used as control transistors, which short-circuit all of the bit lines to one another except for those two bit lines between which the cell to be read out is connected. These control transistors can also be replaced by a configuration of control transistors in the form of a binary decoder, which requires significantly less space since the number of address lines of the binary decoder is less than the number of control lines by means of which control transistors arranged between two bit lines to be short-circuited are individually driven.

The novel memory and the associated read-out method yield the following advantages:

1. The information read is unambiguous, i.e., the continuity test yields only the information content of the read cell (low-impedance or high impedance). The information is not dependent on the state of the adjacent cells.

2. The reading operation is not critical with respect to time, i.e., the continuity test always yields the result of whether the current path is at a high impedance or low impedance irrespective of the measurement time. This result can no longer be influenced by the adjacent memory cells, since they are short-circuited through the bit lines.

The continuity test can be carried out in different ways:

1. A measurement is made of the voltage drop along the current path for an impressed current (constant current intensity).

2. Following the application of a voltage to the current path, the current flow is measured.

3. The current path to be tested is charged from both ends to a specific potential, and then one of the two ends is discharged. If the current path has continuity (low-impedance cell), then the other end of the current path is concomitantly discharged. Otherwise the potential at this end remains unchanged.

The methods according to 1. and 2. have a high power consumption. In contrast, the third method has only a very low power consumption, since for the continuity test it is only necessary to charge the capacitances of the lines and no steady-state current flows.

Other features which are considered as characteristic for the invention are set forth in the appended claims.

Although the invention is illustrated and described herein as embodied in a matrix memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the exemplary embodiments described below, the memory transistors and the control transistors are field-effect transistors. The memory transistors and/or the control transistors may instead be bipolar transistors. The bipolar transistors of the memory cells are connected in the same sense, i.e., in each row of the cell array, the emitter and collector (first and second functional terminals) of adjacent transistors are connected to one another. The bipolar transistors are switchingly driven via their base terminals (third functional terminals).

Figure 1:
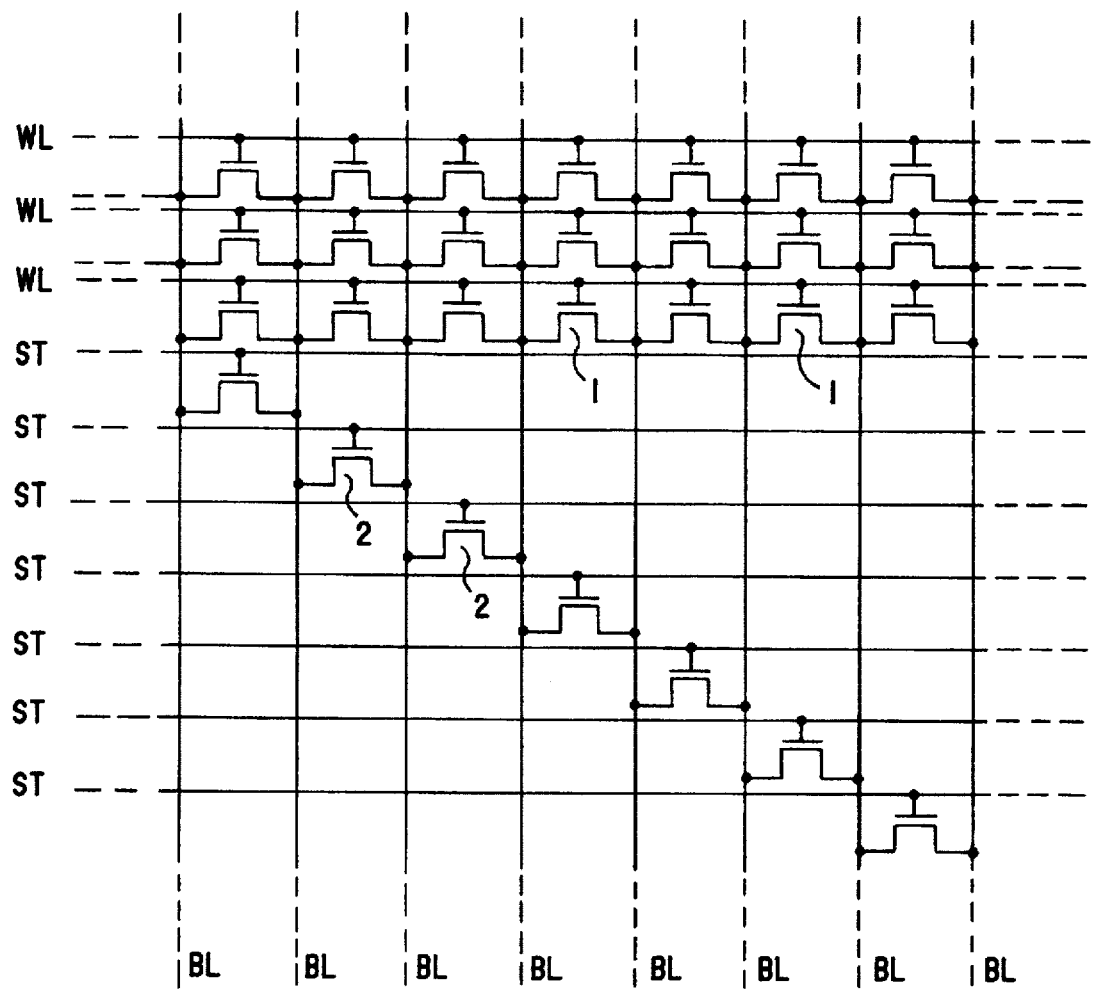
FIG. 1 is a schematic view of a first embodiment of the novel matrix memory.

Referring now to the figures of the drawing in detail and first, particularly, to FIG. 1 thereof, there is seen a first embodiment of a matrix configuration of memory transistors 1. The source and drain terminals (first and second functional terminals) of the memory transistors are each connected to a bit line BL. The gate terminals (third functional terminals) are connected in rows to a word line WL. Except for the two outer bit lines, the bit lines BL are each shared by two columns of memory transistors. Control transistors 2 are provided for the purpose of enabling short-circuiting, via the bit lines, of those memory transistors of an activated word line which are not to be read out. Each of the transistors 2 are connected by source and drain between two adjacent bit lines and the respective gate terminal is in each case connected to a control line ST. The potentials at the gate for each of these control transistors 2 can be set individually via these control lines ST. In this way, all of the control transistors, except for the one which is arranged in the column of the cell to be read out, can be switched on. The bit lines adjoining the switched-on control transistors are short-circuited as a result of this. When that row of cells in which the cell to be read out is disposed is activated via the relevant word line, it is possible to apply a voltage between the two outermost bit lines and thus directly to test whether or not the cell to be read out is conductive. The diagram illustrated in FIG. 1 is to be understood as a detail of a matrix memory according to the invention, which can be extended to any desired extent on all sides.

Figure 2:
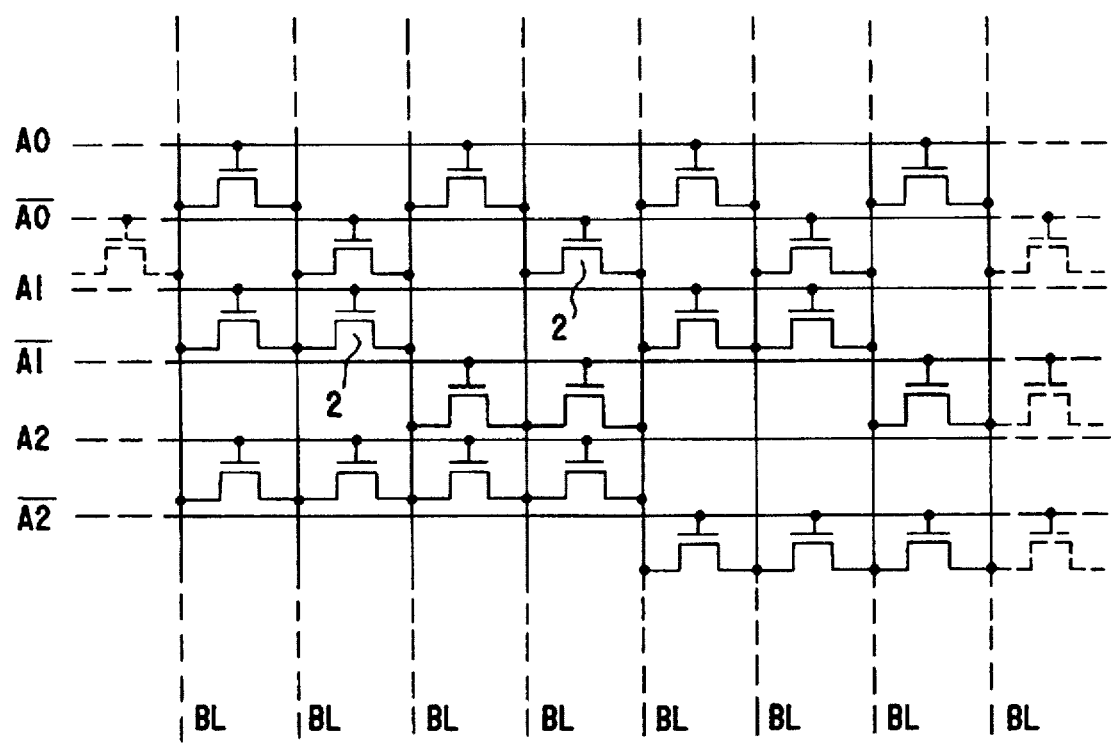
FIG. 2 is a schematic view of a second embodiment.

FIG. 2 illustrates an alternative embodiment of the control transistors shown in the lower part of FIG. 1. This arrangement corresponds to that of a binary decoder. The control transistors 2 are arranged in such a way all of the rows are present in pairs and, in a row of such a pair, control transistors are present precisely at those points at which no control transistors are present in the second row of this pair. In other words, for each row of the arrangement of control transistors, a row complementary thereto is provided. In FIG. 2, the control lines belonging to the respectively complementary rows are provided with a bar over the designation. If, for example, it is intended to test a memory cell which in the detail of FIG. 2 is arranged between the third and fourth bit lines from the left, a short circuit between all of the remaining bit lines is achieved by connecting the depicted control lines $\overline{A0}$, A1 and $\overline{A2}$ to a potential such that the control transistors connected to them are switched on.

In the arrangement of the control transistors in accordance with FIG. 2, the columns correspond to outputs of a binary decoder and the control lines correspond to the inputs of the binary decoder. Such a binary decoder is constructed, in principle, such that a total of $2^n$ outputs is subdivided n times in such a way that the subsets of the preceding subdivisions are halved in each case. Given n=4, for example, the sixteen outputs (number 1 to number 16) are first divided into two subsets each with eight outputs (number 1 to number 8 and number 9 to number 16), each of these subsets is subdivided into subsets each of four outputs (number 1 to number 4 and number 5 to number 8, and number 9 to number 12, and number 13 to number 16 ), these subsets are further subdivided into subsets each of two outputs (number 1 and number 2, number 3 and 4, etc. ) and then the fourth and final subdivision into individual outputs is carried out. A specific output can be addressed by a subset being selected in each of these subdivisions. For example, the fifth output is selected by the first subset of eight outputs (number 1 to number 8) being selected in the first subdivision. In the following subdivision of this subset, the second subset of four outputs (number 5 to number 8) is selected. In the following subdivision, the first subset of two outputs (number 5 and 6) is selected and finally, in the last subdivision, the first output in this subset is selected. In the diagram of FIG. 2, the control line A2 short-circuits the subset, depicted on the left, of four columns between bit lines. The control line A1 short-circuits in each case those bit lines between which the two left-hand columns of a subset of four columns are situated in each case. The control line A1 short-circuits the bit lines between which the respective two right-hand columns of such a subset of four columns are situated. Within these subsets of two columns, the upper control line A0 and the mutually complementary control line $\overline{A0}$ each switch on the respective left-hand and right-hand control transistors, i.e., they short-circuit the adjoining bit lines to one another.

It should now be understood that such an configuration in the form of a binary decoder can be implemented, in principle, for any desired number of bit lines. If the number of columns in which control transistors are to be arranged lies between $2^n$ and $2^{n+1}$, the subdivision into a subset of $2^n$ columns and a subset containing the remaining number of columns is carried out. In the further subdivisions, a corresponding procedure is carried out, in that the respective number is conceptually extended to a power of 2, the subdivision is carried out and the number of surplus columns is simply omitted.

According to the above description of the read-out operation, the entire memory cell array of the novel matrix memory is tested in order to read out one cell. With large memories, the reading operation becomes slow owing to the large cumulative capacitance and owing to the long current path. If, on the other hand, the cell array is divided up into small segments, then the reading operation can be substantially accelerated. Each one of the segments is designed like a matrix memory according to the above description, for example in accordance with the design according to FIG. 1 or FIG. 2. The division of the entire memory into segments is preferably again carried out in the form of a matrix. The segments are then arranged in rows and columns within the matrix. The segments of the same row have the same number of word lines; the segments of the same column have the same number of bit lines. During the read-out of a cell, the entire segment in which the cell is situated is tested for continuity in accordance with the reading method described above. In order that a segment can be selected, external bit lines are provided between the segments, which can be connected to the segment to be selected via selection transistors. Respective control lines are provided for the selection transistors.

Figure 3:
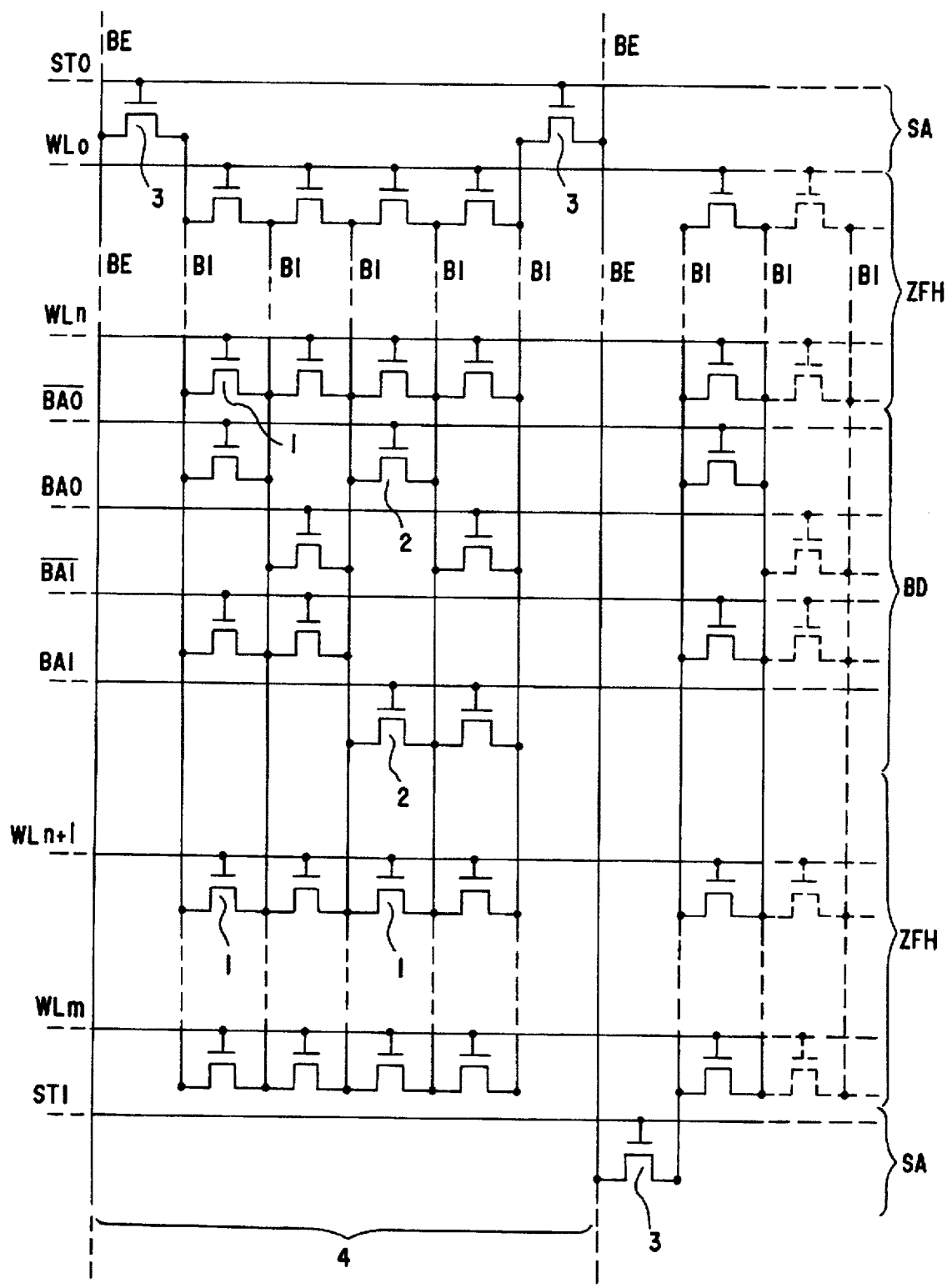
FIG. 3 is a schematic view of a third embodiment.

FIG. 3 illustrates a detail of a configuration of that type. A segment 4 is arranged between two external bit lines BE and two control lines ST0, ST1 for the selection of such a segment. The diagram continues as desired on all sides, which is indicated by the addition of a further segment adjoining the segment 4 to the right. The associated memory transistors 1 are situated in the segment 4 and are in this case arranged in two cell array halves ZFH. The control transistors 2, which in this example are arranged as binary decoder BD, are situated between these cell array halves. The word lines $WL_0, \ldots, W_{1n}, W_{1n+1}, \ldots, WL_m$ leading to the memory transistors are depicted in the cell array halves. Control lines $\overline{BA0}$, BA0, $\overline{BA1}$, BA1, are present for switchably driving the binary decoder BD. The bit lines belonging to the individual segment are the internal bit lines BL. The configuration is in this case implemented such that memory transistors 1 and associated control transistors 2 are respectively connected between two adjacent internal bit lines. The outermost internal bit lines (outer bit lines) of the segment are connected to memory transistors and control transistors to one side only. The continuity test is carried out between these outermost internal bit lines BI. For this purpose, the external bit lines BE are provided on both sides of the segment 4. The field-effect transistors which are provided as selection transistors 3 are switched on via the upper control line ST0. These selection transistors 3 connect an outer internal bit line of the segment to an external bit line. In this way, the relevant segment is selected for the continuity test. The reading operation inside the segment takes place as described above. The external bit lines are preferably connected on two sides to segments via selection transistors. In this way, the segments can be selected with a minimum number of external bit lines. The selection of the segments via the associated control lines ST0, ST1 takes place, in principle, like the activation of memory cells through the word lines.

With the afore-described configuration of the matrix memory, the acceleration of the operation of reading the information of a cell is accompanied by the following advantages:

1. Simultaneous parallel read-out of cells in a plurality of segments is possible after single charging of these segments. Since one memory cell is addressed in each selected segment, a plurality of cells are simultaneously read out. The data information of these cells are stored in parallel, for example, in a shift register and then serially forwarded to the outside. This yields a higher data rate, especially if the data are shifted out of the shift register during the read-out operation.

2. The necessary dynamic, capacitively governed power is reduced, since even a plurality of segments form only part of the entire memory.

3. The potentials of the control transistors (for example binary decoder) are set during the precharging operation, since, after precharging, all of the lines of the selected segments are at the same potential and no compensation currents can flow. This leads to a further time saving in the entire read-out operation.

4. The space requirement for the peripheral circuit which controls the read-out operation decreases both in the direction of the word lines and in the direction of the bit lines. The reduction in the direction of the bit lines is due to the fact that, instead of all the bit lines, only the external bit lines BE (FIG. 3) lead out of the cell array. The reduction in the direction of the word lines is due to the fact that, instead of a word decoder for the entire cell array, only a word decoder for a segment is required if the segments all have the same number of word lines. The same word lines can then be passed as selection lines to all the segments.

In the preferred refinement of the segmented configuration according to FIG. 3, each external bit line is used in each case for segments which are adjacent on both sides. In this way, it is possible to save numerous external bit lines. In order that two adjacent segments are not selected simultaneously via the external bit lines, different control lines ST0, ST1, which select the segments in alternating sequences, are provided for segments which are adjacent to one another in rows. The selection transistors 3 which are provided for the selection of the segment 4 depicted in FIG. 3 are switched on, for example, via the upper control line ST0. The adjoining segment to the right contains selection transistors which are switched on via the lower control line ST1. The result is that these two adjacent segments can be selected alternatively and the common external bit line is not used simultaneously by the two adjacent segments. The rows of selection transistors 3 provided for the selection of segments are depicted in FIG. 3 as segment selection areas SA. The control transistors and memory transistors of a segment can be arranged analogously to the diagrams of FIGS. 1 and 2. Also, in the embodiments of FIGS. 1 and 2, the control transistors can be arranged between the memory transistors to produce a division of the matrix memory into two cell array halves in accordance with FIG. 3. A more extensive subdivision of the cell array or of cell array segments into a plurality of cell array segments by control transistors being disposed in between is also possible.

We claim:

1. A matrix memory, comprising:

a plurality of bit lines, a plurality of word lines, and a plurality of control lines;

a subdivision of the memory matrix into disjunct segments each forming a matrix memory with a plurality of memory transistors disposed in rows and columns, each said memory transistor having a first functional terminal and a second functional terminal connected to a respective one of said bit lines and third functional terminal connected to a respective one of said word lines;

a plurality of control transistors each having a first functional terminal and a second functional terminal connected to a respective one of said bit lines and a third functional terminal connected to a respective one of said control lines;

said control transistors being disposed such that, for each pair of bit lines for which a memory transistor is present, which is connected to both bit lines of the pair, a potential may be set on said control lines for rendering some of said control transistors conductive so that no control transistor electrically connects said bit lines of said respective pair and such that, for each further pair of bit lines for which a memory transistor is present, which is connected to both bit lines of the further pair, at least one of said control transistors effects an electrically conductive connection between said bit lines of the further pair; and an external bit line, a selection transistor and a further control line for each outer bit line of said segment which forms a pair of bit lines with only one other bit line of said segment, for which pair a memory transistor is present which is connected to both bit lines of the respective pair;

a first functional terminal and a second functional terminal of said selection transistor being connected to one of said outer bit line and said external bit line, and a third functional terminal of said selection transistor being connected to said further control line.

2. The matrix memory according to claim 1, wherein said transistors are FET transistors and said first functional terminal is a source terminal, said second functional terminal is a drain terminal, and said third functional terminal is a gate terminal.

3. The matrix memory according to claim 1, wherein said transistors are bipolar transistors and said first functional terminal is an emitter terminal, said second functional terminal is a collector terminal, and said third functional terminal is a base terminal.

4. The matrix memory according to claim 1, wherein each said segment includes a control transistor for each pair of bit lines for which a memory transistor is present, which is connected to both bit lines of the pair, said first functional terminal and said second functional terminal of said control transistor being connected to a respective said bit line of the pair of bit lines, and each control transistor being provided with a dedicated control line.

5. The matrix memory according to claim 1, wherein each said segment has an arrangement of said control transistors which corresponds to an arrangement of a binary decoder with a number of outputs equal to a number of pairs of bit lines having one of said memory transistors connected to both bit lines of said pair.

6. The matrix memory according to claim 1, wherein, except for two said bit lines in each segment, all of said bit lines define two bit line pairs with two other bit lines having a memory transistor connected to both bit lines of a respective said pair.

7. The matrix memory according to claim 1, wherein each segment has two external bit lines and, except for two external bit lines, all of the external bit lines together with two respective other external bit lines form a pair of external bit lines for which a segment is present, which segment is connected via selection transistors to both said external bit lines of the pair.

8. The matrix memory according to claim 7, wherein said selection transistors which are connected to the same said external bit line are connected to respectively different control lines (ST0, ST1).

* * * * *